United States Patent [19]

Krahl et al.

[11] Patent Number: 5,177,361
[45] Date of Patent: Jan. 5, 1993

[54] ELECTRON ENERGY FILTER

[75] Inventors: Dieter Krahl; Hans Pätzold, both of Berlin; Albrecht Rilk, Königsbronn; Johannes Bihr, Aalen, all of Fed. Rep. of Germany

[73] Assignee: Carl-Zeiss-Stiftung, Heidenheim, Fed. Rep. of Germany

[21] Appl. No.: 812,626

[22] Filed: Dec. 23, 1991

[30] Foreign Application Priority Data

Dec. 22, 1990 [DE] Fed. Rep. of Germany ....... 4041495

[51] Int. Cl.⁵ .............................................. H01J 49/46
[52] U.S. Cl. ............................ 250/305; 250/396 ML; 250/298; 250/311
[58] Field of Search .............. 250/305, 396 ML, 298, 250/311

[56] References Cited

U.S. PATENT DOCUMENTS 3,659,236  4/1972  Whitehead ........................ 250/298
4,740,704  4/1988  Rose et al. ................. 250/396 ML
4,760,261  7/1988  Rose et al. .................. 250/396 ML Primary Examiner—Jack I. Berman
Attorney, Agent, or Firm—Walter Ottesen

[57] ABSTRACT

The invention is directed to an electron energy filter which is assembled from three or four plates placed together in a sandwich-like configuration. The pole pieces are seated on the inner sides of the outer plates and attached thereto. The pole pieces can therefore be produced in pairs so that their outer surfaces match precisely. This assembly is economical and provides a precise manufacture.

16 Claims, 4 Drawing Sheets

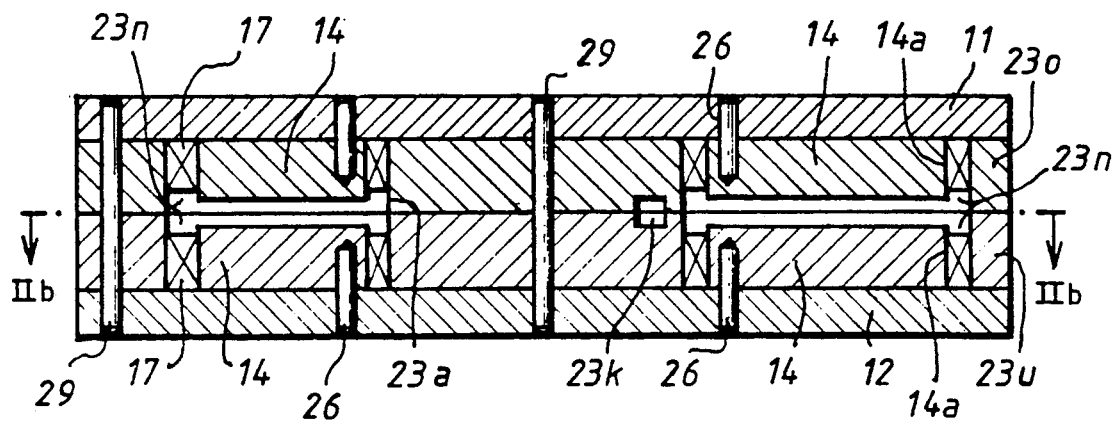
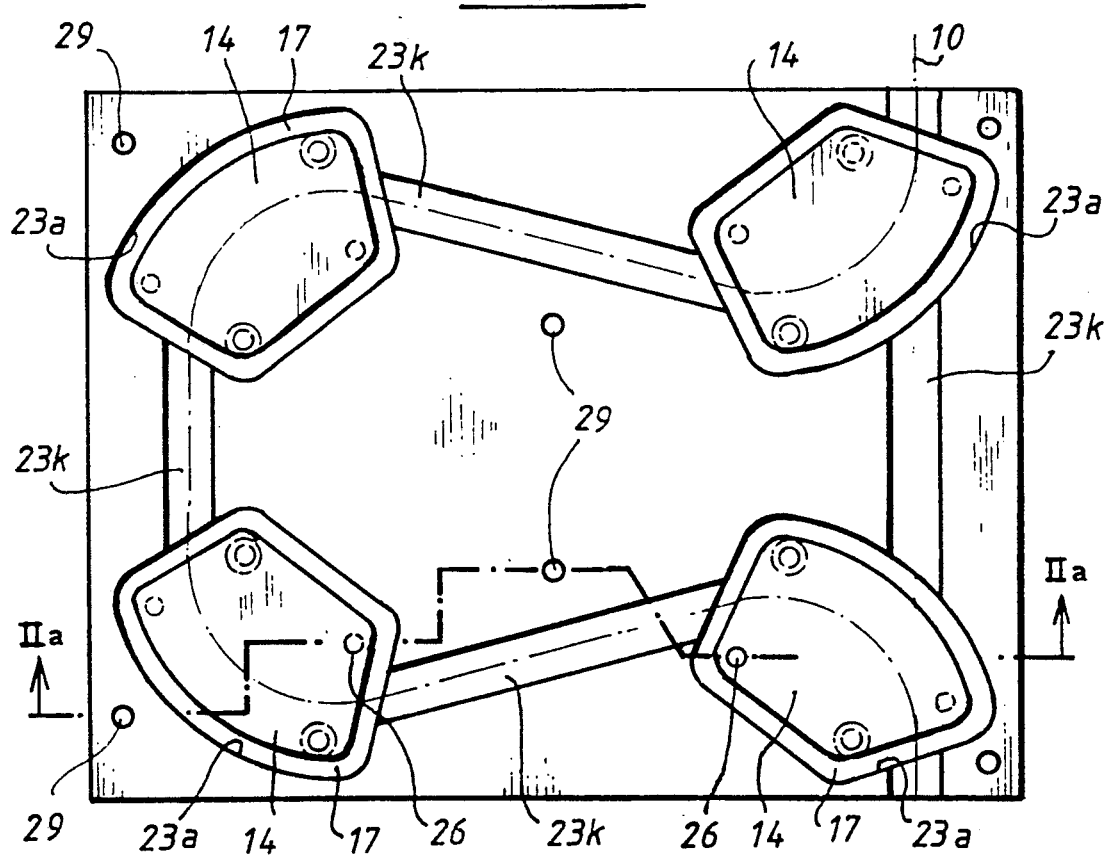

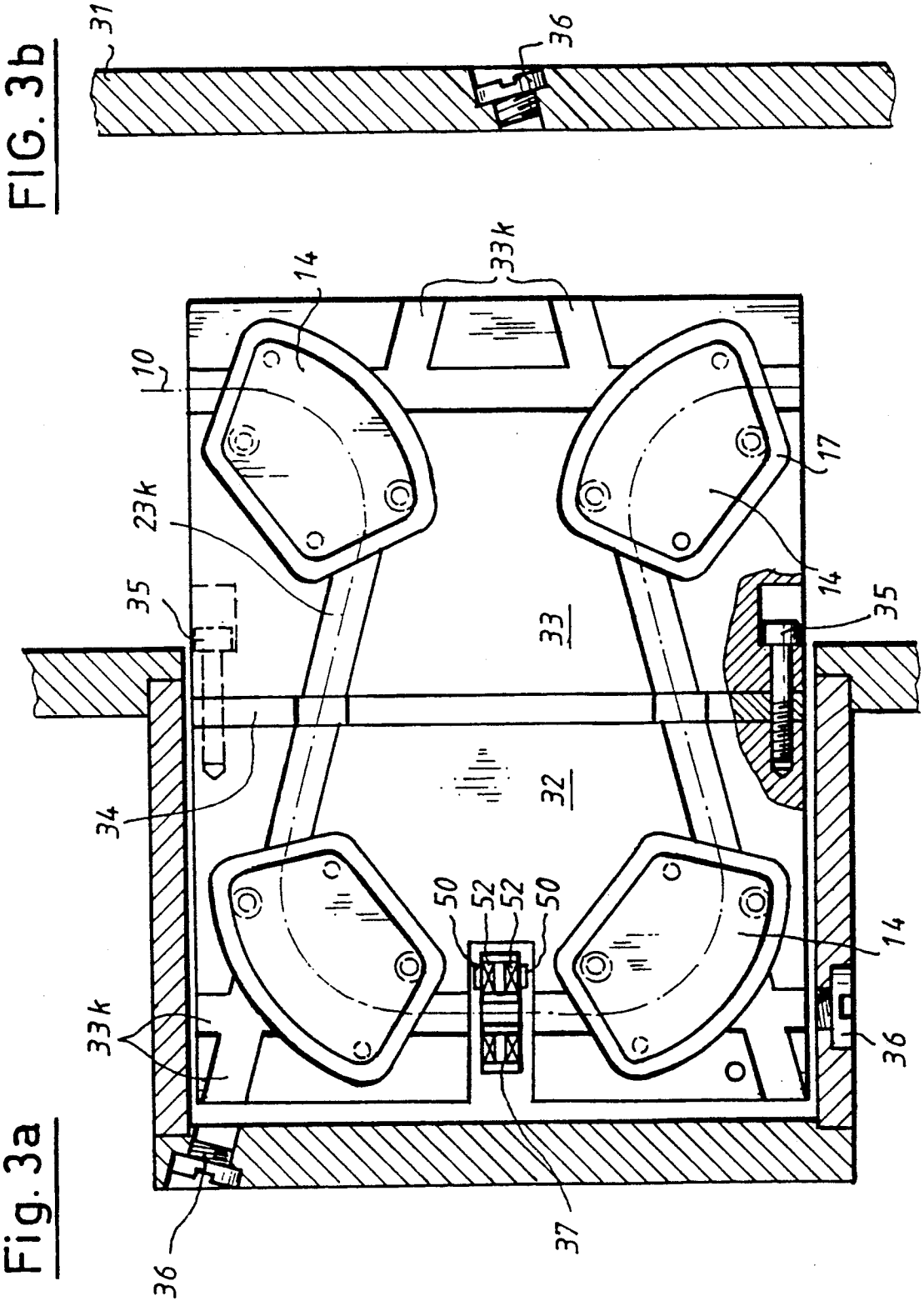

ELECTRON ENERGY FILTER

FIELD OF THE INVENTION

The invention relates to an electron energy filter such as of the alpha or omega type and includes plate-shaped parts having pole pieces bounded by slots for the current coils and having channels in shielding regions between the pole pieces.

BACKGROUND OF THE INVENTION

Imaging electron energy filters, also known as electron filters, energy filters or electron energy spectrometers are used in transmission electron microscopes to improve contrast of the image of the specimen by selecting electrons of a particular energy range as well as to register element distribution images and filtered electron diffraction diagrams. An alpha filter is disclosed in U.S. Pat. No. 4,760,261 and an omega filter is disclosed in U.S. Pat. No. 4,740,704.

Such filters include magnets having pole pieces above and below a symmetry plane wherein the center axis of the electron beam is guided. Homogeneous magnetic fields are generated between the pole piece pairs which deflect the electron beam several times so that its center axis in the alpha filter corresponds approximately to the lowercase Greek letter alpha and, in the case of the omega filter, to an uppercase Greek letter omega.

The deflecting radii of the electrons are dependent upon their velocity in the magnetic fields. For this reason, an energy spectrum of the transmitted electrons is obtained downstream of the filter of which a region can be masked.

Such electron energy filters mostly include several separate magnetic fields or deflecting regions which are separated from each other by more or less large spaces having field free regions. In these regions, the electron beam runs in a straight line between shielding plates. In the two patents referred to above, an embodiment is described wherein the pole pieces define a common part with the shielding plates such that the filters are assembled from two mirror-image symmetrical parts in which the pole pieces and the required channels for the electron beam are machined. Although a very good stability of the filter is obtained in this way in a simple manner, it has however been shown that such a mechanical assembly is quite expensive if the required precision in the mechanical dimensions is to be maintained.

SUMMARY OF THE INVENTION

In view of the foregoing, it is an object of the invention to provide an assembly for electron energy filters wherein an adequate mechanical precision is obtained at relatively low cost.

The object is realized by providing an electron energy filter which includes an outer upper plate, an outer lower plate and an inner plate assembled to form a sandwich-like assembly; a plurality of upper pole pieces mounted on the upper plate and a plurality of lower pole pieces mounted on the lower plate adjacent corresponding ones of the upper pole pieces so as to form respective pole piece pairs defining respective gaps between the pole pieces of each pair; a plurality of current coils disposed on respective ones of the pole pieces for coacting therewith to produce magnetic fields in corresponding ones of the gaps for deflecting an electron beam as the beam passes through the filter; the inner plate having a plurality of cutouts formed therein for accommodating the pole pieces of each pole piece pair; the cutouts being so dimensioned that each pole piece and the inner plate conjointly define a slot for receiving a corresponding one of the current coils therein; and, channel means formed in the inner plate for interconnecting the gaps to define a path through the filter for the electron beam.

It is advantageous that the electron filter is assembled from two or four regions which are separated by gaps of non-magnetic material or by air or vacuum gaps.

For an omega filter, it is known to arrange a hexapole for correction purposes between the second and third pole piece pairs in a filter having four pole pairs. It has been shown to be especially advantageous for correcting as well as for making adjustments to superpose a quadrupole field on the hexapole field which is generated by ancillary windings on four of the six current coils of the hexapole.

It is advantageous to configure the channels between the pole piece pairs up to the outer boundary of the plates and to mount fluorescent screens or detection system for adjustment or measurement purposes at the outer boundary.

It is likewise advantageous to provide a channel in the direction of the electron optical axis of the electron beam apparatus. This channel provides for a free passage of the electron beam when the energy filter is switched off, for example, for adjusting the electron beam apparatus.

In a further advantageous embodiment of the invention, the current coils, which are mounted around the pole pieces, have primary and secondary windings with the primary windings being connected in series and the secondary windings being connected individually or in combination, as required in order to correct magnetic non-uniformities of the individual pole pieces.

In an especially advantageous embodiment, the filter assembled from the plates is adjustable as a functional unit and attached to a vacuum flange and can be seated with the latter in a corpuscular beam apparatus. The adjustable attachment can, for example, comprise a parallelogram guide of rods and adjusting devices or comprise an x-y table.

BRIEF DESCRIPTION OF THE DRAWINGS

The invention will now be described with reference to the drawings wherein:

FIG. 2a shows an electron energy filter according to another embodiment of the invention taken along line IIa—IIa of FIG. 2b;

FIG. 2b is a schematic representation of the filter of FIG. 2a taken along line IIb—IIb;

FIGS. 3a and 3b are section views taken through an electron energy filter having two regions;

DESCRIPTION OF THE PREFERRED EMBODIMENTS OF THE INVENTION

Figure 1A:
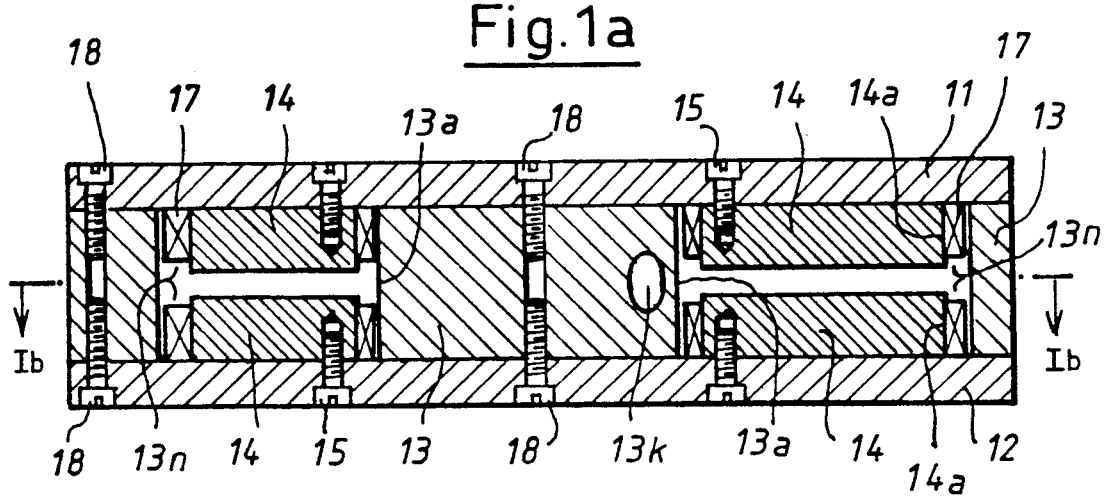
FIG. 1a is a section view of an electron energy filter according to an embodiment of the invention taken along line Ia—Ia of FIG. 1b.
Figure 1B:
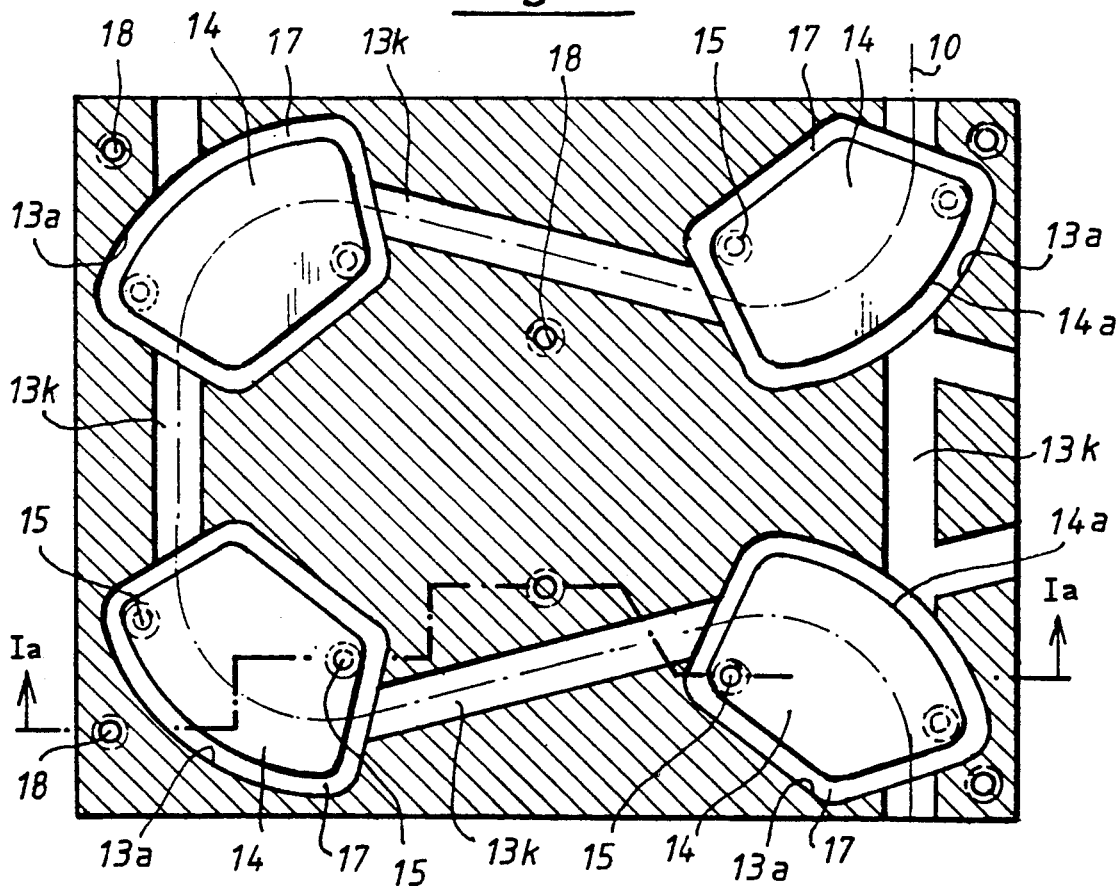
FIG. 1b is a section view of the filter of FIG. 1a taken along line Ib—Ib.

FIGS. 1a and 1b show the same electron energy filter in two different sections. The filter is assembled from two outer plates (11, 12) and an inner plate 13 in a sandwich-like configuration. In FIG. 1b, the center axis of the electron beam 10 runs in the plane of the drawing. In FIG. 1a, the center axis of the electron beam runs in the plane perpendicular to the plane of the drawing which passes through the center of plate 13.

The pole pieces 14 are seated on the inner sides of the outer plates (11, 12) and attached to the outer plates, for example, with screws 15. The pole pieces 14 can therefore be produced in pairs so that their outer edges 14a match precisely notwithstanding their complicated cross section. During assembly of the filter, and after the pole shoes are attached to the outer plates (11, 12), the current coils 17 are first laid around the pole pieces 14 and thereafter the outer plates (11, 12) are seated on the inner plate 13 and attached, for example, with screws 18.

Before assembly, cutouts 13a are milled into the outer plate 13 with the cutouts being so dimensioned that slots 13n for the current coils 17 are formed in the assembled condition between the pole pieces 14 and the inner plate 13. Furthermore, channels 13k are bored into the inner plate 13 through which the electron beam runs in a straight line magnetically shielded between the pole piece pairs.

An especially advantageous assembly of the electron energy filter is shown in FIGS. 2a and 2b. In this embodiment, the inner part of the filter comprises two inner plates (23p, 23u). The channels 23k between the pole piece pairs can therefore be produced by milling which is considerably simpler from a technical standpoint than the bores 13k in FIG. 1. With this assembly also, the pole pieces 14 are seated on the inner sides of the outer plates (11, 12) and are attached thereto so that they likewise can be produced in pairs. Adjusting pins 26 can be used for obtaining a precise positioning of the pole pieces. Corresponding adjusting pins 29 can also be used for a precise positioning of the outer plates (11, 12) and the inner plates (23p, 23u) to each other.

In this case too, the cutouts 23a in the inner plates (23p, 23u) are so dimensioned that, in the assembled condition, the slots 23n for the current coils 17 are formed between the pole pieces 14 and the inner plates (23p, 23u). During the assembly of the electron energy filter, the pole pieces 14 are first likewise attached to the outer plates (11, 12). Thereafter, the corresponding inner plate (23p, 23u) is seated on each outer plate (11, 12) and the current coils 17 are seated therein. As a last step, the two halves of the filter are put together.

It is also possible, for example, to use three inner plates with the center plate having the elevation of the channels or the spacing of the pole piece surfaces so that the channels and the cutouts for the pole shoes need not be machined out of the outer plates.

FIGS. 3a and 3b show an electron energy filter seated in the column 31 of an electron microscope. In this filter, the inner plates comprise two areas 32 and 33 which are separated by a gap 34. The gap comprises a non-magnetic material such as bronze. The two plates 32 and 33 are connected securely to each other with screws 35. An assembly of this kind affords advantages with respect to the production thereof. It is possible to provide a further gap (not shown) perpendicular to the gap 34 so that a total of four regions are provided with each region having a pole piece pair.

A hexapole 37 is arranged in the center between the second and third pole piece pairs. The hexapole 37 functions in a known manner to improve the imaging characteristics of the electron energy filter. The reference numerals 52 identify one coil of the six coils of the hexapole 37 which cuts the plane of the paper twice. It has been shown that superposing a quadrupole field on the hexapole field is advantageous for imaging characteristics as well as for adjusting purposes. The quadrupole field is generated by additional windings on the coils of the hexapole. One coil of the additional winding of the quadrupole is identified by reference numeral 50. The quadrupole windings generate respective magnetic fields which are perpendicular to the optical axis 10 in the same manner as hexapole fields. However only four of the six hexapole coils are provided with an additional coil of the quadrupole. For this reason, the hexapole coil to the left of the optical axis is shown without an additional coil of the quadrupole.

It is furthermore advantageous to configure the channels 23k up the outer boundaries of the plates by extension channels 33k. Then, the closure pieces 36 can be replaced by fluorescent screens or others detection systems.

Figure 4A:
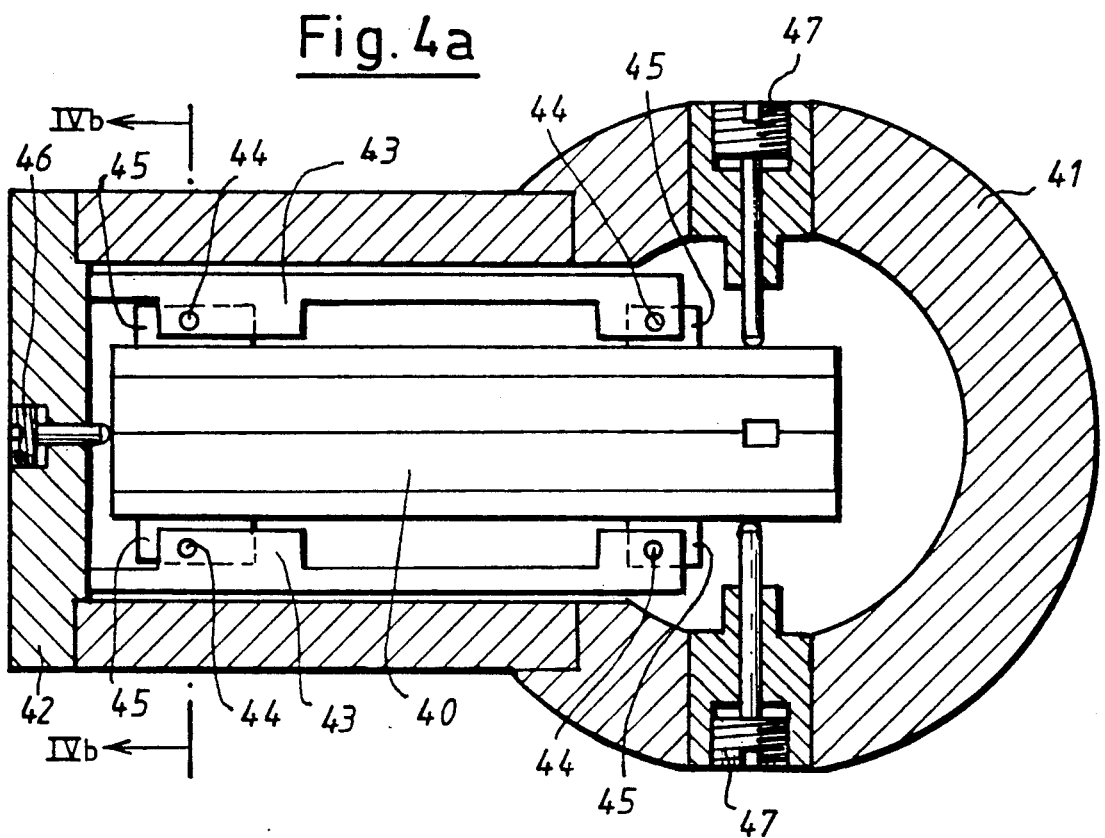
FIG. 4a is a section view of a parallelogram-like attachment of an electron energy filter taken along line IVa—IVa of FIG. 4b; and, FIG. 4b is a section view of the attachment of the electron energy filter of FIG. 4a taken along line IVb—IVb.
Figure 4B:
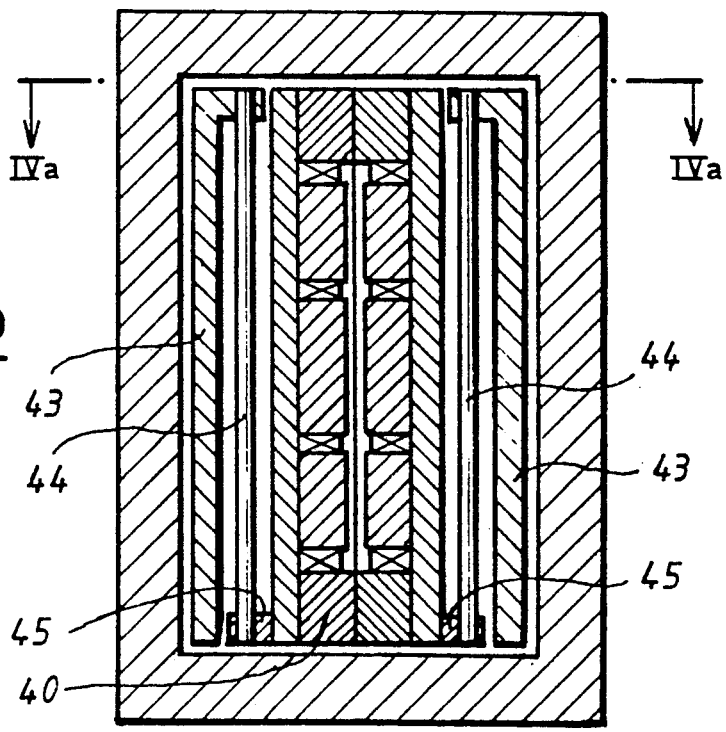

The attachment of the electron energy filter in an electron microscope is shown in FIGS. 4a and 4b. The filter 40 is suspended as a function unit in a parallelogram guide which is attached to the flange 42. The filter can therefore be removed from the column 41 of the electron microscope with this flange 42. A two part frame 43 is attached to the flange 42 wherein four round rods 44 are clamped. These rods are connected at their other ends via intermediate pieces 45 to the filter 40 which, because of the elasticity of the round rods 44, can be adjusted with respect to the optical axis of the electron beam apparatus by means of the displacement devices 46 and 47.

It is understood that the foregoing description is that of the preferred embodiments of the invention and that various changes and modifications may be made thereto without departing from the spirit and scope of the invention as defined in the appended claims.

What is claimed is:

1. An electron energy filter comprising:
    an outer upper plate, an outer lower plate and an inner plate assembled to form a sandwich-like assembly;
    a plurality of upper pole pieces mounted on said upper plate and a plurality of lower pole pieces mounted on said lower plate adjacent corresponding ones of said upper pole pieces so as to form respective pole piece pairs defining respective gaps between the pole pieces of each pair;
    a plurality of current coils disposed on respective ones of said pole pieces for coacting therewith to produce magnetic fields in corresponding ones of said gaps for deflecting an electron beam as the beam passes through the filter;
    said inner plate having a plurality of cutouts formed therein for accommodating the pole pieces of each pole piece pair;
    said cutouts being so dimensioned that each pole piece and said inner plate conjointly define a slot for receiving a corresponding one of said current coils therein; and, channel means formed in said inner plate for interconnecting said gaps to define a path through the filter for the electron beam.

2. The electron energy filter of claim 1, said inner plate being a single plate and said channel means comprising a plurality of bores formed in said inner plate to define respective passages between said gaps and into and out of said filter.

3. The electron energy filter of claim 1, further comprising non-magnetic partition means for partitioning at least one of said plates into at least two regions.

4. The electron energy filter of claim 3, said non-magnetic means comprising gap means for partitioning said at least one of said plates into at least two portions; and, a non-magnetic material disposed in said gap means.

5. The electron energy filter of claim 1, said pole pairs being four in number including first, second, third and fourth pole piece pairs; and, said filter further comprising: hexapole means mounted between said second and third pole piece pairs for generating a hexapole field; and, additional windings mounted on said hexapole means for superposing a quadrupole field on said hexapole field.

6. The electron energy filter of claim 1, wherein said filter is utilized with fluorescent screens or a detection system for adjustment or measurement purposes, wherein said inner plate has an outer edge defining the outer periphery of the filter and wherein said filter further comprises extension passage means extending from said channel means at the region of said gaps to said periphery to facilitate the use of the fluorescent screens or the detection system at said periphery.

7. The electron energy filter of claim 1, each of said current coils including primary and secondary windings, said primary windings being connected in series and said secondary windings being connected individually or in combination.

8. An electron energy filter comprising:
an outer upper plate, an outer lower plate and first and second inner plates assembled to form a sandwich-like assembly;
a plurality of upper pole pieces mounted on said upper plate and a plurality of lower pole pieces mounted on said lower plate adjacent corresponding ones of said upper pole pieces so as to form respective pole piece pairs defining respective gaps between the pole pieces of each pair;
a plurality of current coils disposed on respective ones of said pole pieces for coacting therewith to produce magnetic fields in corresponding ones of said gaps for deflecting an electron beam as the beam passes through the filter;
said first inner plate having a plurality of cutouts formed therein for accommodating the pole pieces mounted on said upper plate and said second inner plate having a plurality of cutouts formed therein for accommodating the pole pieces mounted on said lower plate;
said cutouts being so dimensioned that each pole piece and the inner plate corresponding thereto conjointly define a slot for receiving a corresponding one of said current coils therein;
said first and second inner plates having respective surfaces which are mutually adjacent;
first slot means formed in the surface of said first inner plate and second slot means formed in the surface of said second inner plate; and,
said first and second slot means being mutually adjacent to conjointly define a channel interconnecting said gaps and providing a path through the filter for the electron beam.

9. The electron energy filter of claim 8, further comprising non-magnetic partition means for partitioning at least one of said plates into at least two regions.

10. The electron energy filter of claim 9, said non-magnetic means comprising gap means for partitioning said at least one of said plates into at least two portions; and, a non-magnetic material disposed in said gap means.

11. The electron energy filter of claim 8, said pole pairs being four in number including first, second, third and fourth pole piece pairs; and, said filter further comprising: hexapole means mounted between said second and third pole piece pairs for generating a hexapole field; and, additional windings mounted on said hexapole means for superposing a quadrupole field on said hexapole field.

12. The electron energy filter of claim 8, wherein said filter is utilized with fluorescent screens or a detection system for adjustment or measurement purposes, wherein said inner plate has an outer edge defining the outer periphery of the filter and wherein said filter further comprises extension passage means extending from said channel at the region of said gaps to said periphery to facilitate the use of the fluorescent screens or the detection system at said periphery.

13. The electron energy filter of claim 8, each of said current coils including primary and secondary windings, said primary windings being connected in series and said secondary windings being connected individually or in combination.

14. A combination of an electron energy filter and an electron microscope defining an electron beam axis along which the electron beam of the electron microscope travels, the combination comprising:
a microscope column surrounding said beam axis and defining the interior of the microscope;
a vacuum flange extending laterally from said column;
an electron energy filter;
adjusting means arranged in said vacuum flange for adjusting the position of said filter with respect to said electron beam axis to permit the electron beam to pass therethrough; and,
said electron energy filter including:
two outer plates and an inner plate assembled to form a sandwich-like assembly;
a plurality of upper pole pieces mounted on said upper plate and a plurality of lower pole pieces mounted on said lower plate adjacent corresponding ones of said upper pole pieces so as to form respective pole piece pairs defining respective gaps between the pole pieces of each pair;
a plurality of current coils disposed on respective ones of said pole pieces for coacting therewith to produce magnetic fields in corresponding ones of said gaps for deflecting the electron beam as the beam passes through the filter;
said inner plate having a plurality of cutouts formed therein for accommodating the pole pieces of each pole piece pair;
said cutouts being so dimensioned that each pole piece and said inner plate conjointly define a slot for receiving a corresponding one of said current coils therein; and, channel means formed in said inner plate for interconnecting said gaps to define a path through the filter for the electron beam.

15. The combination of claim 14, said adjusting means being a parallelogram guide for holding and positioning said filter relative to said beam axis.

16. The combination of claim 15, said parallelogram guide including a plurality of elastic rods connecting said filter to said vacuum flange; and, displacing means for applying a displacing force to said filter thereby causing said elastic rods to bend and permitting said filter to be shifted relative to said beam axis.

* * * * *